US006756799B1

(12) United States Patent
Seltzer

(10) Patent No.: US 6,756,799 B1
(45) Date of Patent: Jun. 29, 2004

(54) MULTI-METER TEST LEAD SYSTEM

(76) Inventor: Richard Bryon Seltzer, 309 Ellen Way, Brandon, FL (US) 33510

( * ) Notice: Subject to any disclaimer, the term of this patent is extended or adjusted under 35 U.S.C. 154(b) by 198 days.

(21) Appl. No.: 10/125,339

(22) Filed: Apr. 18, 2002

(51) Int. Cl.[7] .................... G01R 31/02

(52) U.S. Cl. .................... 324/754; 324/72.5; 324/149; 439/436; 439/482

(58) Field of Search .................... 324/72.5, 149, 324/133, 555–556, 690, 754, 761–762; 439/391, 436, 482, 828–829

(56) References Cited

U.S. PATENT DOCUMENTS 3,864,629 A * 2/1975 Danna .................... 324/72.5
4,738,633 A * 4/1988 Fremgen et al. .................... 439/436
5,416,405 A * 5/1995 Dill .................... 324/72.5
6,437,556 B1 * 8/2002 Sparks .................... 324/149

* cited by examiner

*Primary Examiner*—Minh N. Tang
(74) *Attorney, Agent, or Firm*—Edward P. Dutkiewicz

(57) ABSTRACT

A multi-meter test lead system has a probe having a pointed distal end and a proximal end couplable to supplemental electronic components. An outer sleeve has a distal end with a semi-cylindrical opening and a proximal end with a circular opening at the end and slots adjacent thereto. An inner sleeve has and open distal with an adjacent opening and a pair of diametrically opposed slots adjacent to the proximal end. The inner sleeve is adapted to slidably receive the probe and with the inner sleeve and probe are adapted to be slidably positioned within the outer sleeve to allow movement of the inner sleeve axially inwardly of the outer sleeve in response to a force by the user. A coil spring is within the outer sleeve. A pair of finger pads with an action pin extending through the outer sleeve and inner sleeve.

5 Claims, 18 Drawing Sheets

10 12 14 16 18 19 20 22 24 26 28 30 32 36 38 40 42 44 48 52 54 56

MULTI-METER TEST LEAD SYSTEM

BACKGROUND OF THE INVENTION

1. Field of the Invention

The present invention relates to a multi-meter test lead system and more particularly pertains to accurately testing lines using one hand.

2. Description of the Prior Art

The use of test lead systems is known in the prior art. More specifically, test lead systems previously devised and utilized for the purpose of test lead systems are known to consist basically of familiar, expected, and obvious structural configurations, notwithstanding the myriad of designs encompassed by the crowded prior art which has been developed for the fulfillment of countless objectives and requirements.

The prior art does not describe a multi-meter test lead system that allows accurately testing lines using one hand.

In this respect, the multi-meter test lead system according to the present invention substantially departs from the conventional concepts and designs of the prior art, and in doing so provides an apparatus primarily developed for the purpose of accurately testing lines using one hand.

Therefore, it can be appreciated that there exists a continuing need for a new and improved multi-meter test lead system which can be used for accurately testing lines using one hand. In this regard, the present invention substantially fulfills this need.

SUMMARY OF THE INVENTION

In view of the foregoing disadvantages inherent in the known types of test lead systems now present in the prior art, the present invention provides an improved multi-meter test lead system. As such, the general purpose of the present invention, which will be described subsequently in greater detail, is to provide a new and improved multi-meter test lead system and method which has all the advantages of the prior art and none of the disadvantages.

To attain this, the present invention first comprises a probe. The probe is fabricated of electrically conductive stainless steel in a generally cylindrical configuration. The probe has a distal end formed with a point. The probe also has a proximal end. A probe spring is coupled with respect to the probe at the proximal end to supplemental electronic components. Next provided is an outer hollow sleeve. The outer sleeve is in a generally cylindrical configuration. The outer sleeve has a distal end formed with a formed cone-shaped point. The outer sleeve also has a semi-cylindrical opening adjacent to the distal end of the outer hollow sleeve for receiving an insulated test lead to be tested. The outer sleeve also has a proximal end with a pair of diametrically opposed slots. The outer sleeve also has an opening at the distal end. An inner cylindrical sleeve is next provided. The inner sleeve is fabricated of an electrically insulating material. The inner sleeve has an open distal end and also has an open proximal end. The inner sleeve is formed with a generally semi-cylindrical opening adjacent to the distal end of the inner cylindrical sleeve. The inner sleeve also has a pair of diametrically opposed slots formed therein adjacent to the proximal end of the inner cylindrical sleeve. The inner sleeve is adapted to slidably receive the probe. The inner sleeve and the probe are adapted to be slidably positioned within the outer sleeve. The proximal end of the inner sleeve extends proximally of the proximal end of the outer sleeve to allow movement of the inner sleeve axially inwardly of the outer sleeve in response to a force by a user as created by the user's palm. A coil spring is provided. The coil spring is positioned within the outer sleeve adjacent to the distal end of the outer sleeve in contact with the distal end of the inner sleeve. The coil spring provides a resilient force against the urging of a force by the user's palm on the inner sleeve. A retaining screw is provided. The retaining screw extends through the inner sleeve proximal the slot in the inner sleeve. Lastly, a pair of finger pads are provided. An action pin is also provided. The action pin extends through the slots of the outer sleeve and the inner sleeve and are coupled to the probe through the probe spring to allow a user to provide a proximal force to the probe after the user has created a distal force through the inner sleeve. In this manner, the probe will move out of the semi-cylindrical opening of the inner sleeve to allow the placing of the insulated test lead therein and upon relieving of the forces by the finger pads and palm of the user, the probe will pierce the insulated test lead in the semi-cylindrical opening to allow for testing for electricity and continuity. Upon the re-application of forces by the user's fingers and palm, the probe will be retracted from the insulated lead in the semi-cylindrical opening provides a counteracting force pushing the insulated test lead away from the point of the probe.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved multi-meter test lead system which has all of the advantages of the prior art test lead systems and none of the disadvantages.

It is another object of the present invention to provide a new and improved multi-meter test lead system which may be easily and efficiently manufactured and marketed.

It is further an object of the present invention to provide a new and improved multi-meter test lead system which is of durable and reliable constructions.

An even further object of the present invention is to provide a new and improved multi-meter test lead system which is susceptible of a low cost of manufacture with regard to both materials and labor, and which accordingly is then susceptible of low prices of sale to the consuming public, thereby making such multi-meter test lead system economically available to the buying public.

Even still another object of the present invention is to provide a multi-meter test lead system for accurately testing lines using one hand.

Lastly, it is an object of the present invention to provide a new and improved multi-meter test lead system having a probe with a pointed distal end. An outer sleeve has a distal end with a semi-cylindrical opening and a proximal end with a circular opening at the end and slots adjacent thereto. An inner sleeve has open distal with an adjacent opening and a pair of diametrically opposed slots and a proximal end. The inner sleeve is adapted to slidably receive the probe and with the inner sleeve and probe are adapted to be slidably positioned within the outer sleeve to allow movement of the inner sleeve axially inwardly of the outer sleeve in response to a force by the use. A coil spring is within the outer sleeve. A pair of finger pads have an action pin extending through the outer sleeve and inner sleeve.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

The same reference numerals refer to the same parts throughout the various Figures.

DESCRIPTION OF THE PREFERRED EMBODIMENT

Figure 1:
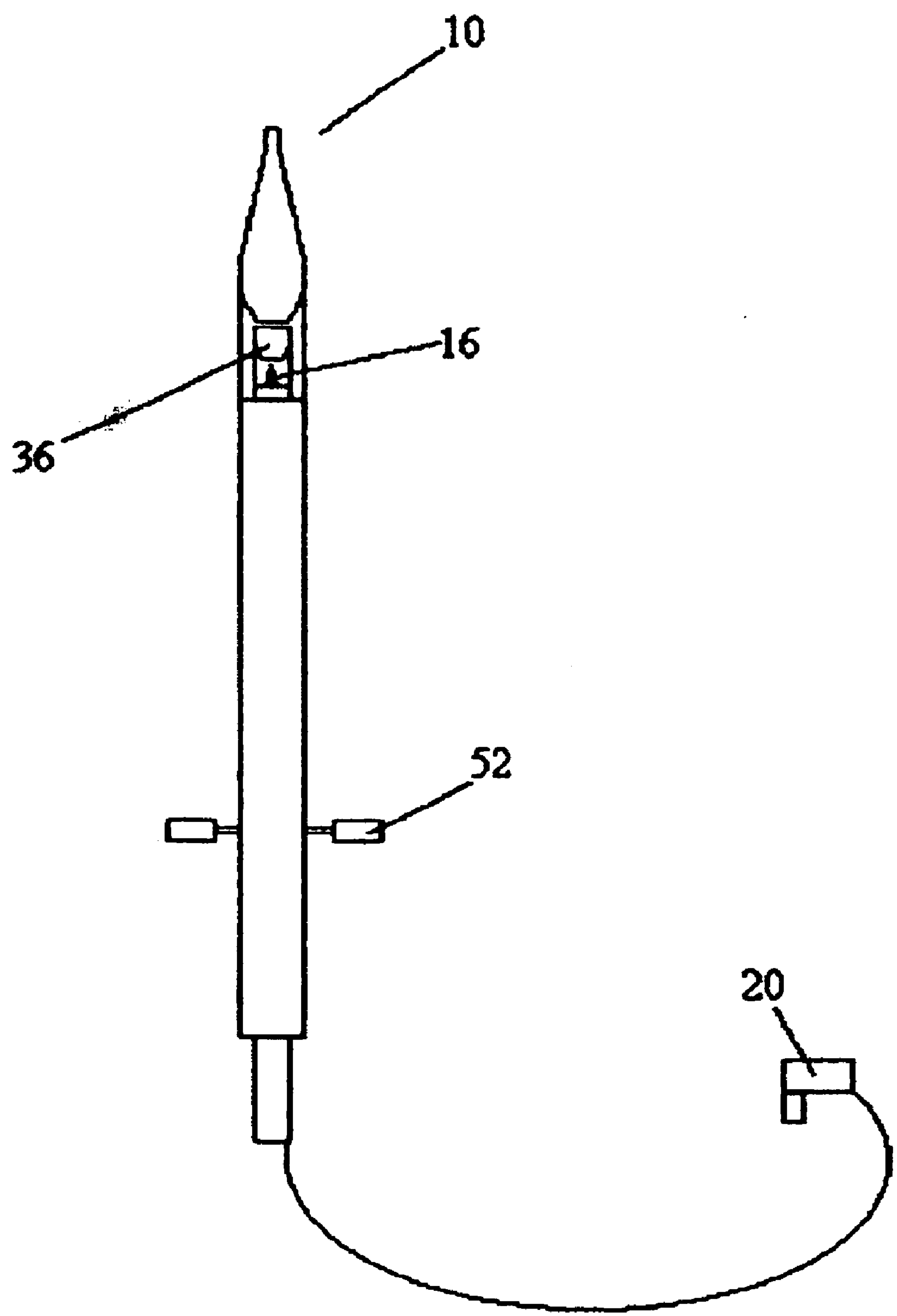
FIG. 1 is a front elevational view of the primary embodiment of the present invention as disclosed herein.

With reference now to the drawings, and in particular to FIG. 1 thereof, the preferred embodiment of the new and improved multi-meter test lead system embodying the principles and concepts of the present invention and generally designated by the reference numeral 10 will be described.

The present invention, the multi-meter test lead system 10 is comprised of a plurality of components. Such components in their broadest context include a probe, an outer sleeve, an inner sleeve, a coil spring and a pair of finger pads. Such components are individually configured and correlated with respect to each other so as to attain the desired objective.

First provided is a probe 12. The probe is fabricated of electrically conductive stainless steel in a generally cylindrical configuration. The probe has a distal end 14 formed with a point 16. The probe also has a proximal end 18. The proximal end is couplable to a probe spring 19 to allow retraction of the probe, the probe is also couplable to supplemental electronic components 20 which could include but limited to an alligator clip or test equipment.

Next provided is an outer hollow sleeve 22. The outer sleeve is in a generally cylindrical configuration. The outer sleeve has a distal end 24. The outer sleeve also has a semi-circular opening 26 adjacent to the distal end of the outer hollow sleeve for receiving an insulated test lead to be tested. The outer sleeve also has a proximal end 28 with a pair of diametrically opposed slots 30. The outer sleeve also has an opening 32 at the proximal end 28 and an opening 26 at the distal end.

An inner cylindrical sleeve 36 is next provided. The inner sleeve is fabricated of an electrically insulating material. The inner sleeve has an open distal end 38 and also has a proximal end 40. The probe is installed at the proximal end. The inner sleeve is formed with a generally semi-cylindrical opening 42 adjacent to the distal end of the inner cylindrical sleeve. The inner sleeve also has a pair of diametrically opposed slots 44 formed therein adjacent to the proximal end of the inner cylindrical sleeve. The inner sleeve is adapted to slidably receive the probe. The inner sleeve and the probe are adapted to be slidably positioned within the outer sleeve. The proximal end of the inner sleeve extends proximally of the proximal end of the outer sleeve to allow movement of the inner sleeve axially inwardly of the outer sleeve in response to a force by a user as created by the user's palm.

A coil spring 48 is provided. The coil spring is positioned within the outer sleeve adjacent to the distal end of the outer sleeve in contact with the distal end of the inner sleeve. The coil spring provides a resilient force against the urging of a force by the user's palm on the inner sleeve.

Figure 2:
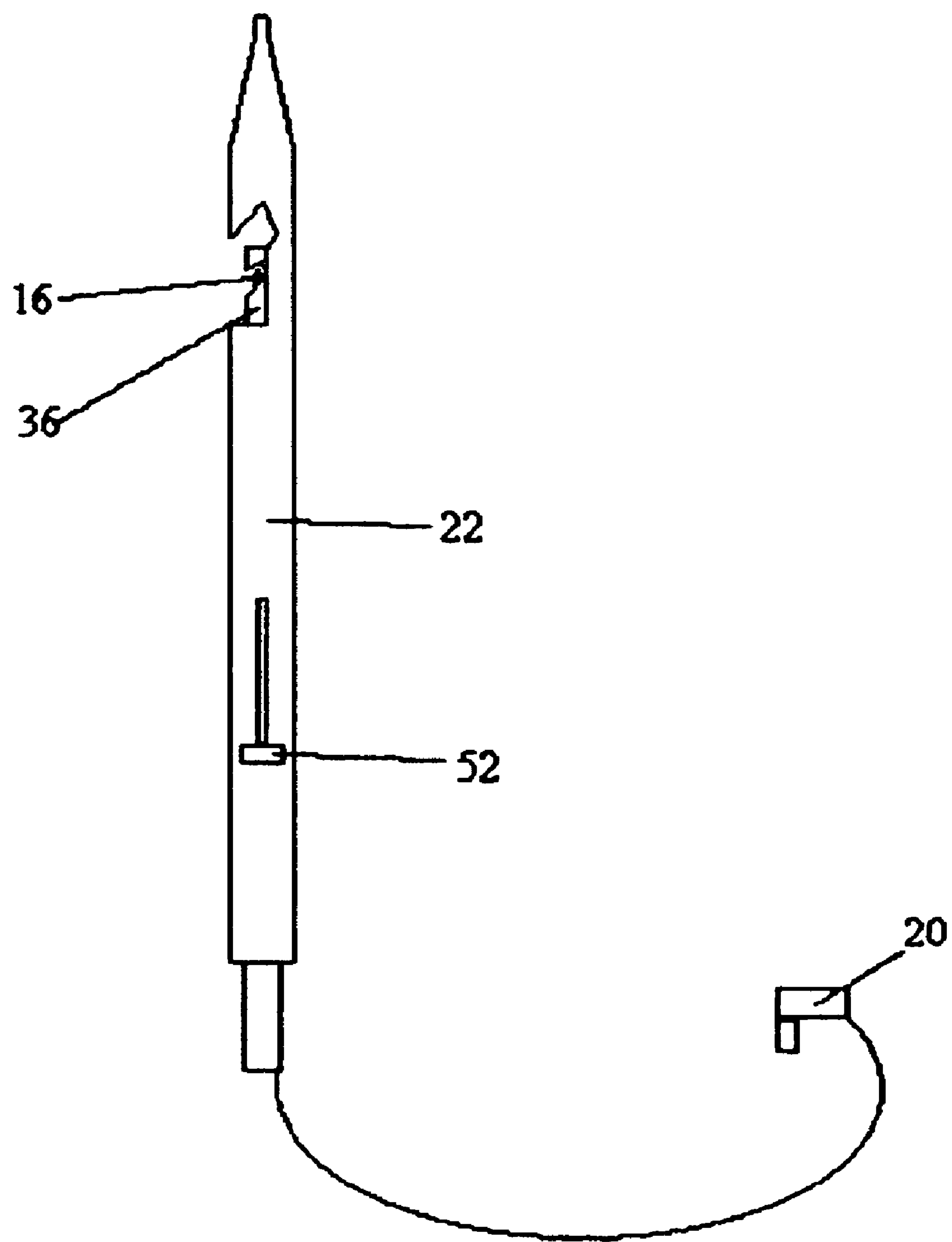
FIG. 2 is a side elevational view of the primary embodiment of the present invention.
Figure 3:
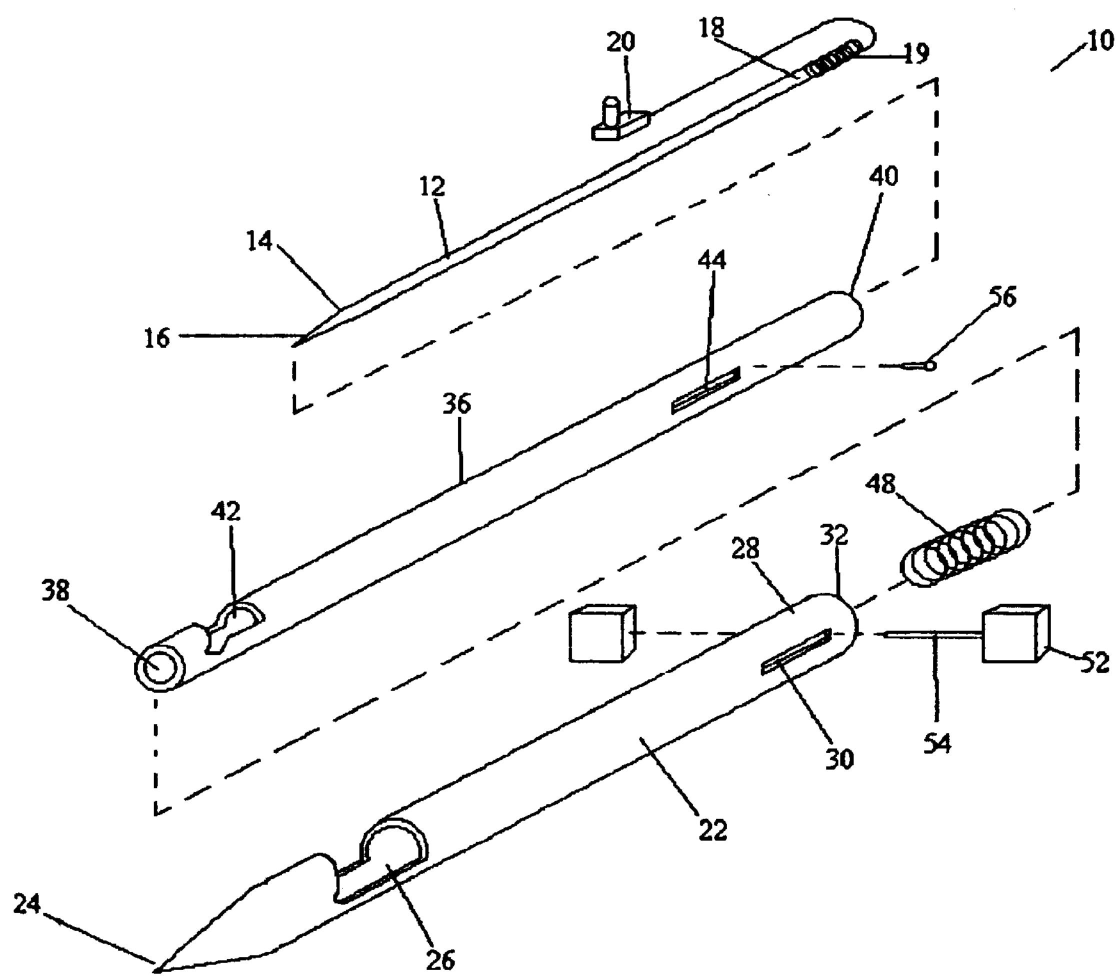
FIG. 3 is an exploded view of the primary embodiment of the present invention.

Lastly, a pair of finger pads 52 are provided. An action pin 54 is provided. The action pin extends through the slots of the outer sleeve and the inner sleeve and are coupled to the probe through the probe spring to allow a user to provide a proximal force to the probe after the user has created a distal force through the inner sleeve. Further provided is a retaining screw 56 adapted to retain the inner sleeve within the outer sleeve and retain the probe in the inner sleeve. In this manner, the probe will move out of the semi-cylindrical opening of the inner sleeve to allow the placing of the insulated test lead therein and upon relieving of the forces by the finger pads and palm of the user, the probe will pierce the insulated test lead in the semi-cylindrical opening to allow for the testing for electricity and continuity. Upon the re-application of forces by the user's fingers and palm, the probe will be retracted from the insulated test lead while the semi-cylindrical opening provides a counteracting force pushing the insulated test lead away from the point of the probe. FIGS. 1 and 2 are front and side views of the primary embodiment while FIG. 3 is an exploded view.

In operation in use, the user moves his hand into position. The hand is placed over the proximal end of the test probe. The user's fingers are located at the finger pads, or action pin, and the palm at the inner sleeve end. The fingers and palm begin action at the proximal end by bringing the inner sleeve end and action pin closer together. Action is noted by inner sleeve moving away from the proximal, and stainless steel test probe moving proximal. Retracting action is complete when the stainless steel probe is fully retracted and hidden in the inner sleeve. One-handed dual action test probe can now be used to clamp test the subject wires. The wires may be of various or several gauges. Next the one-handed dual action test probe is clamped onto the test subject by the release of pressure by the fingers and palm. The actions above are repeated to release the test subject.

Figure 10:
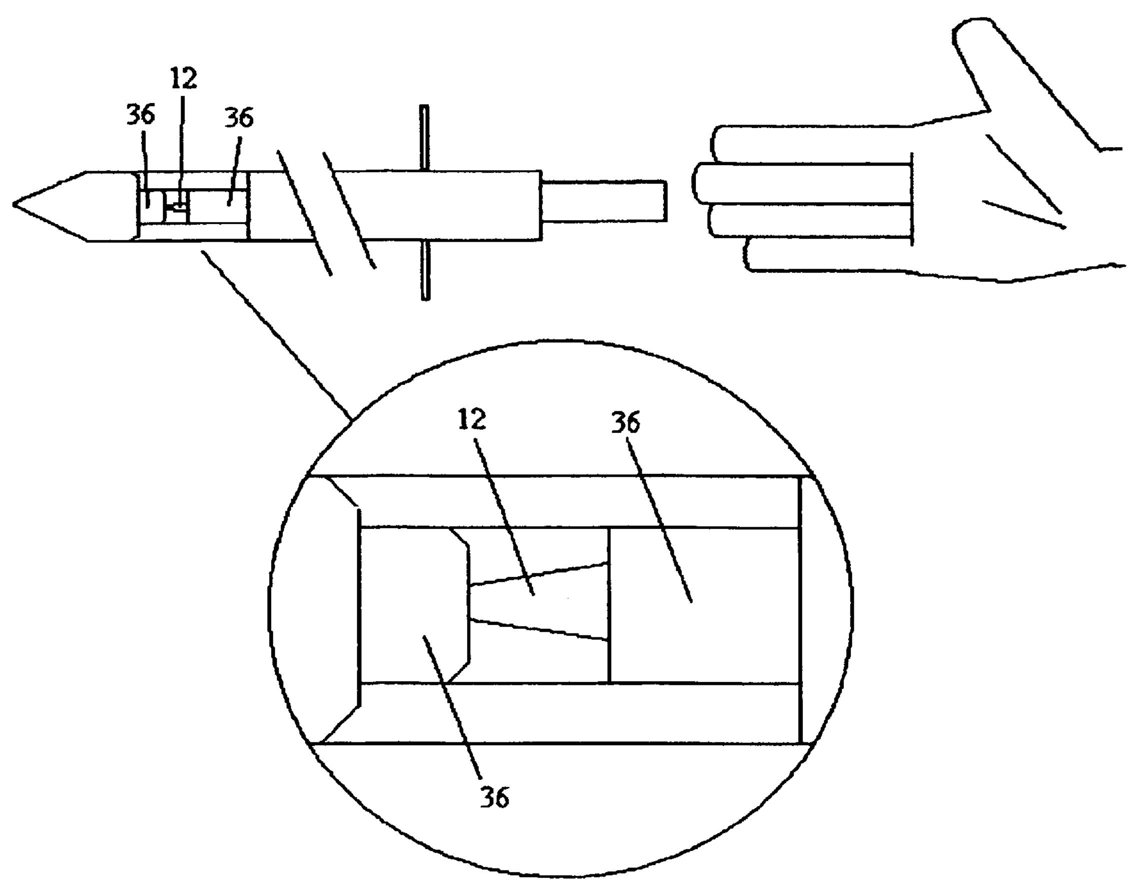
FIGS. 10 through 18 illustrate the operation of the system.
Figure 11:
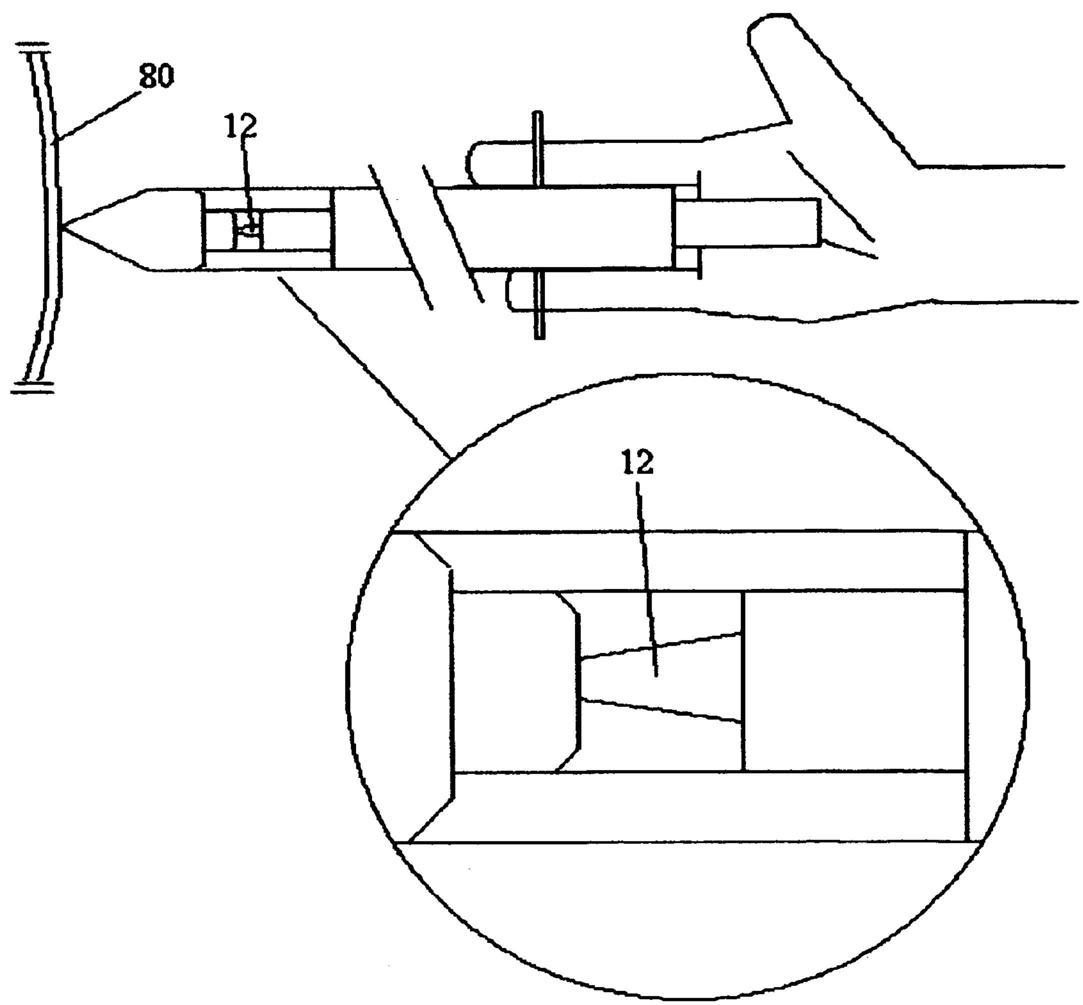
Figure 12:
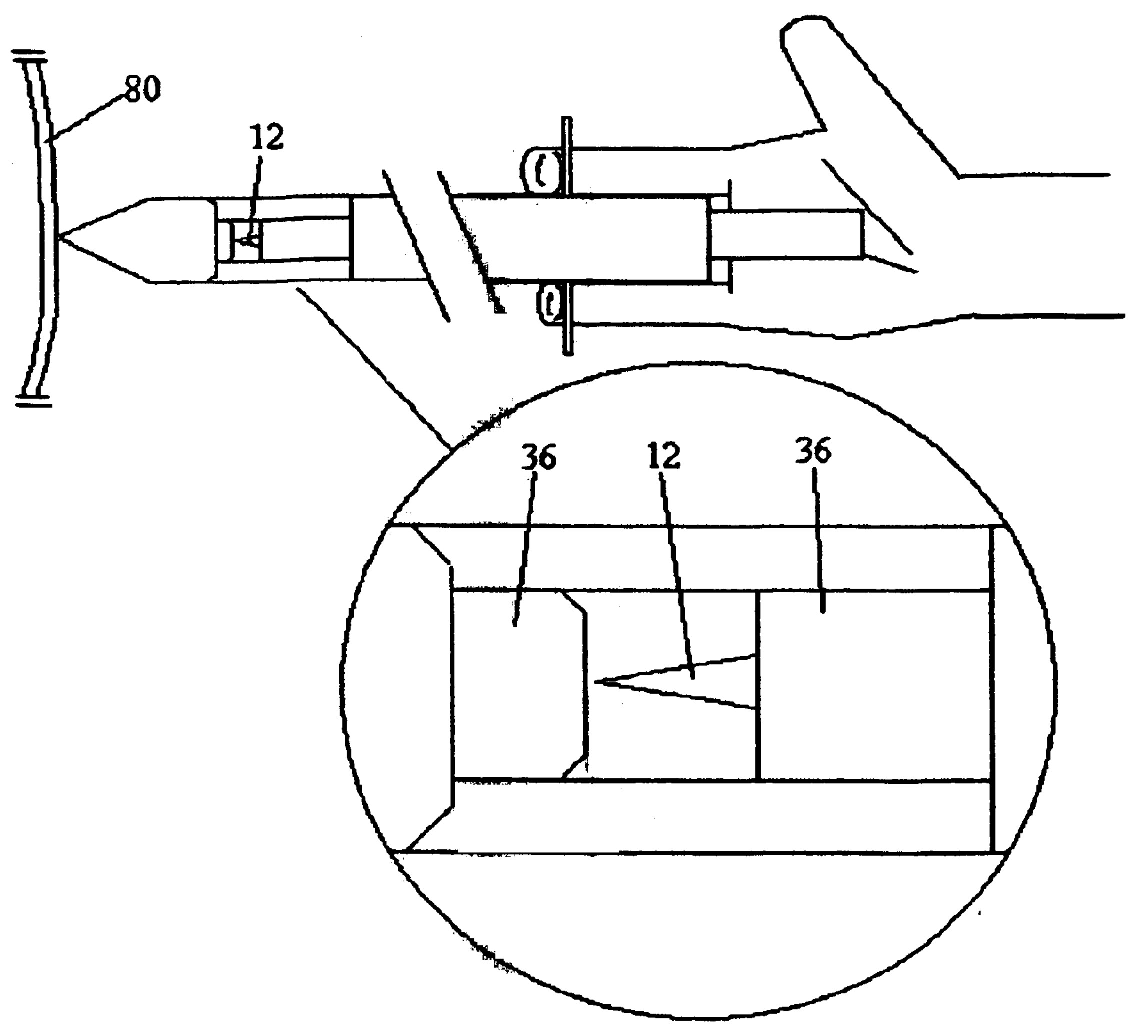
Figure 13:
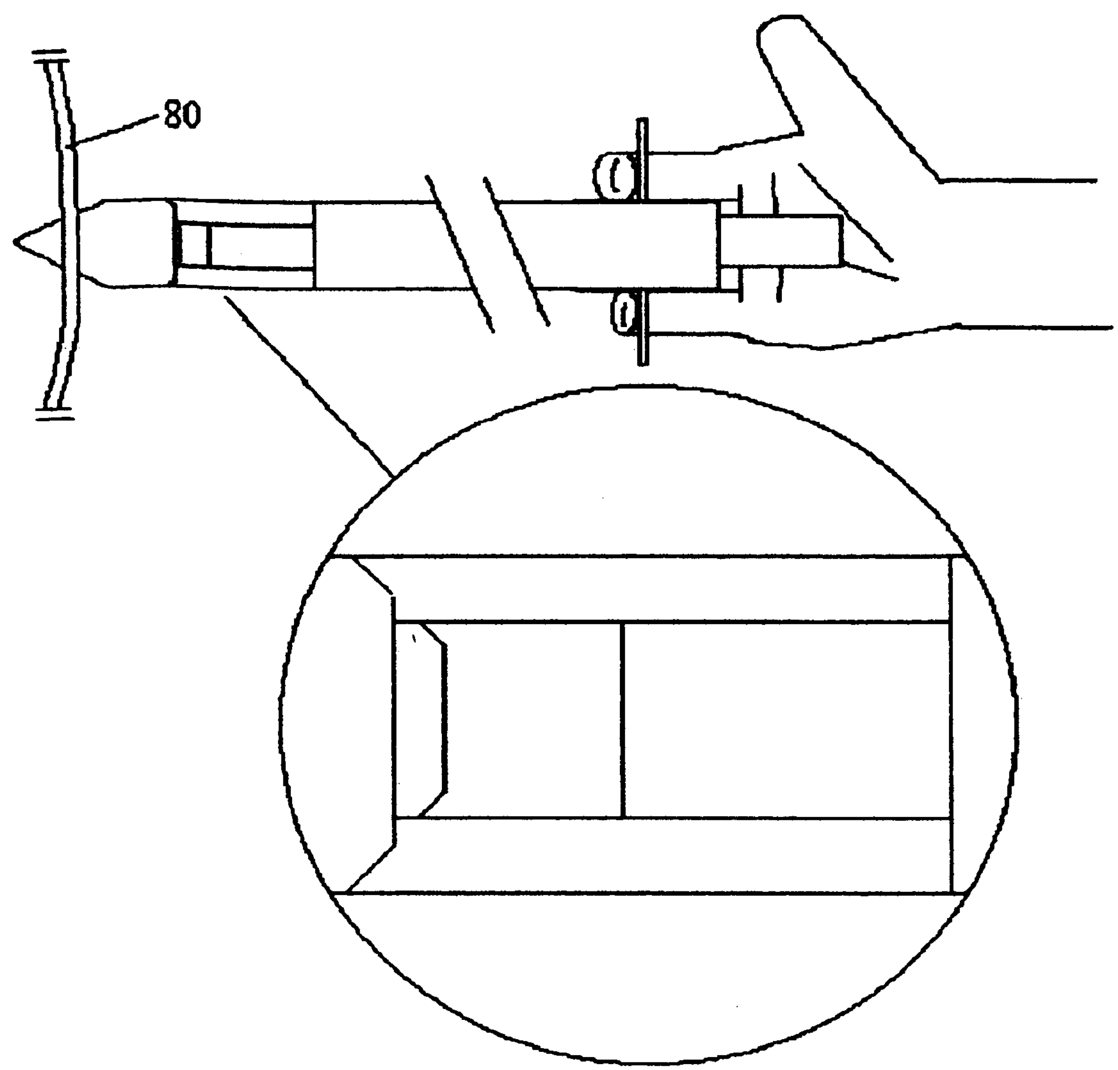
Figure 14:
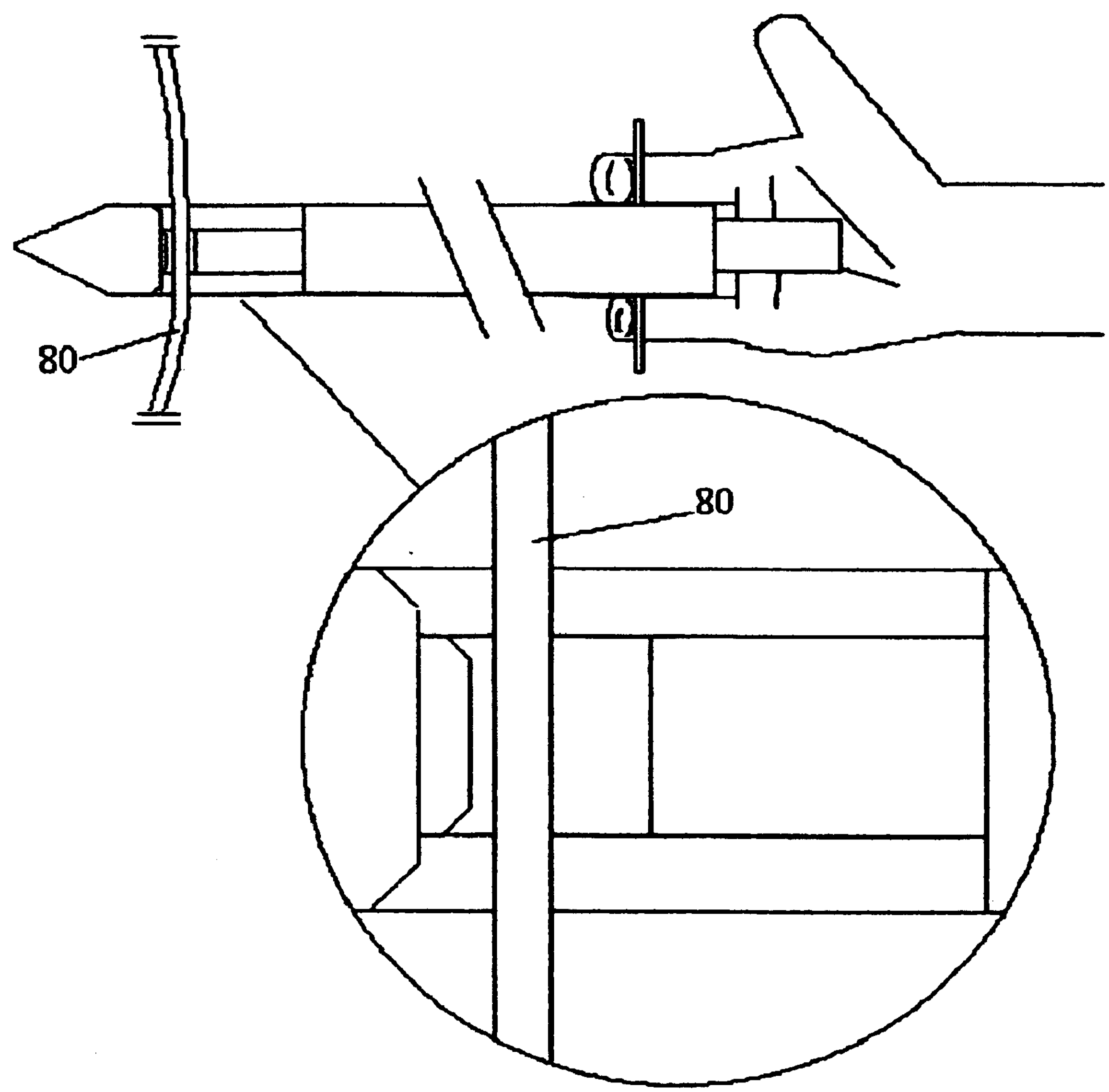
Figure 15:
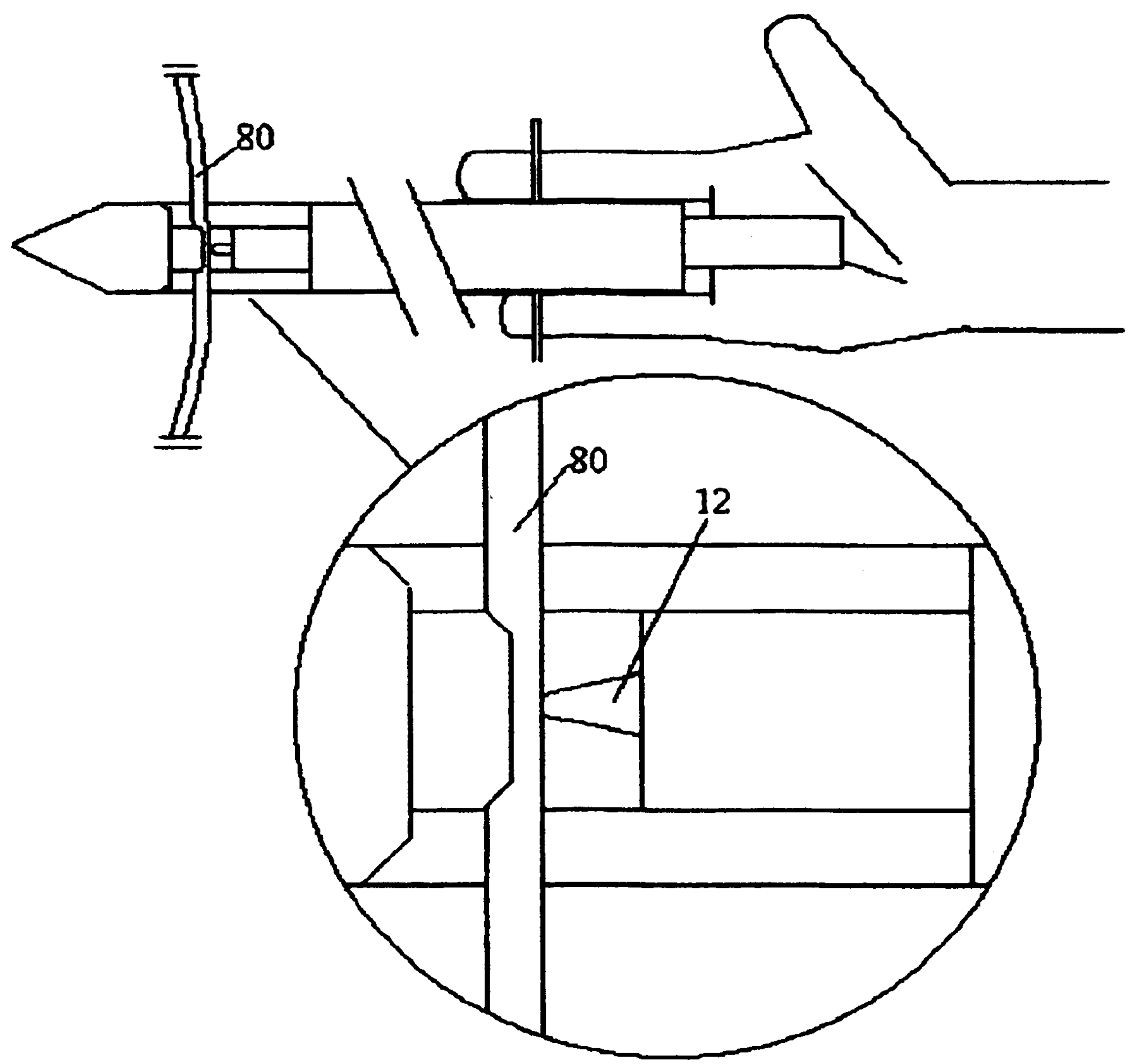
Figure 16:
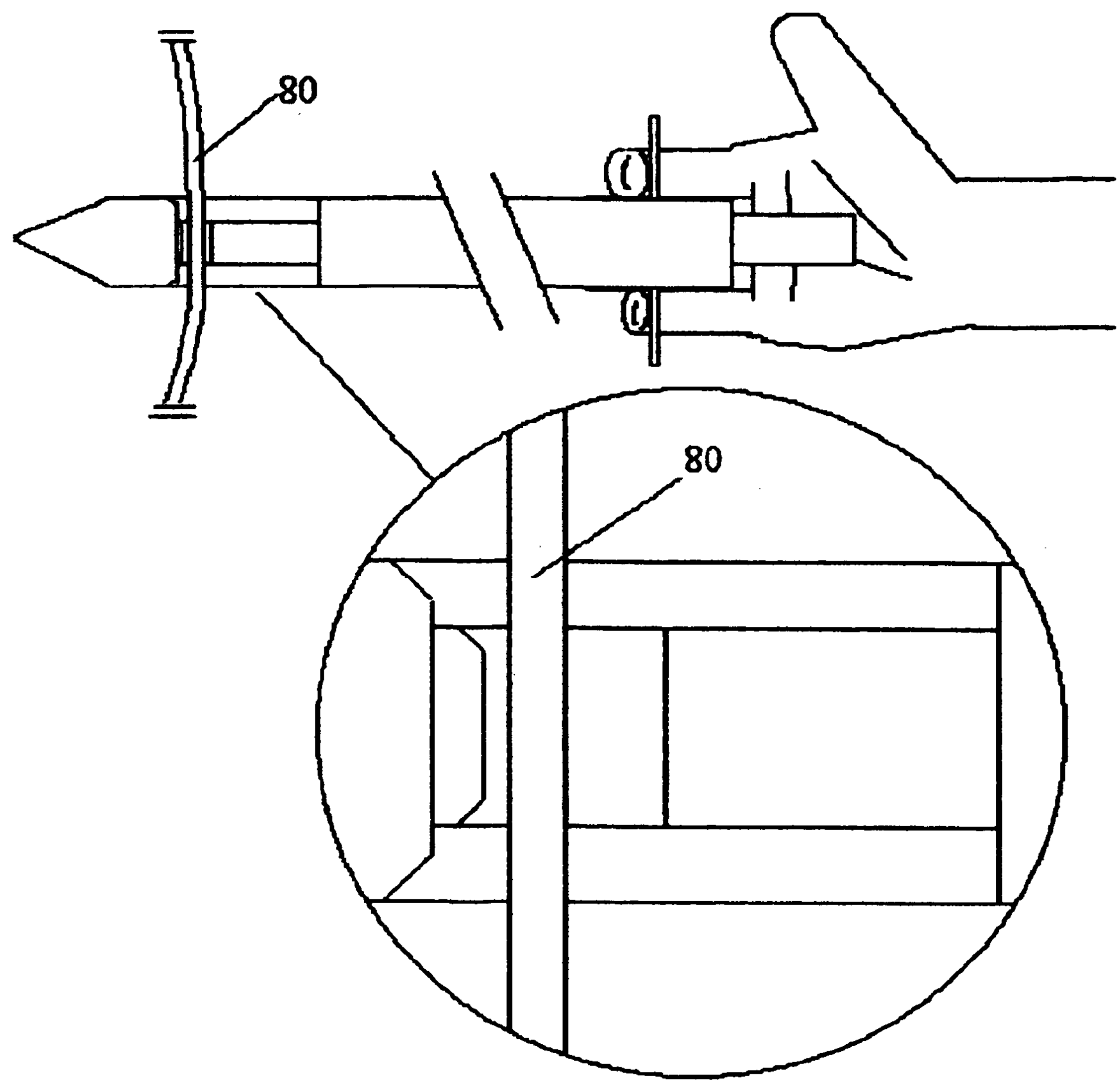
Figure 17:
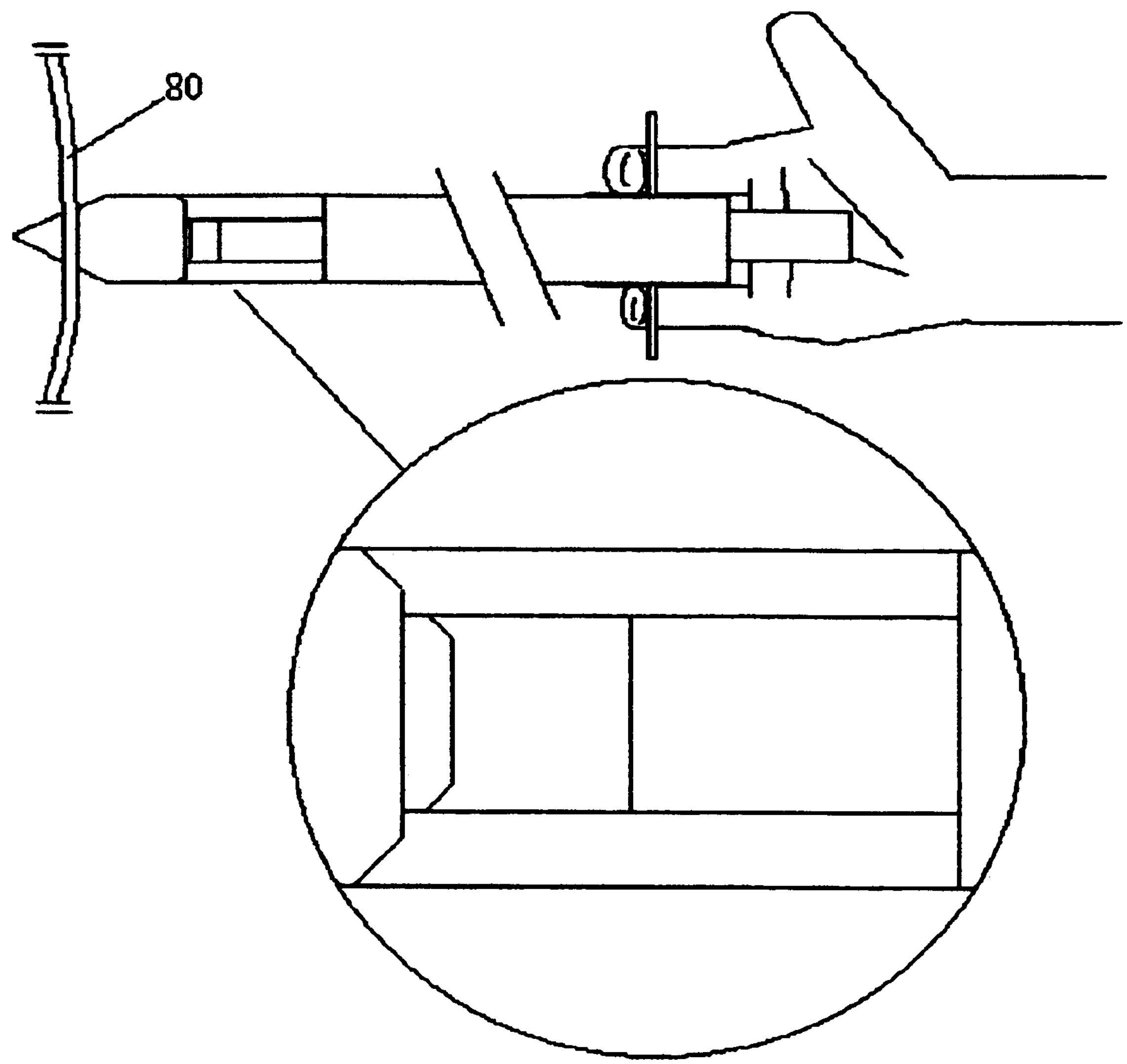
Figure 18:
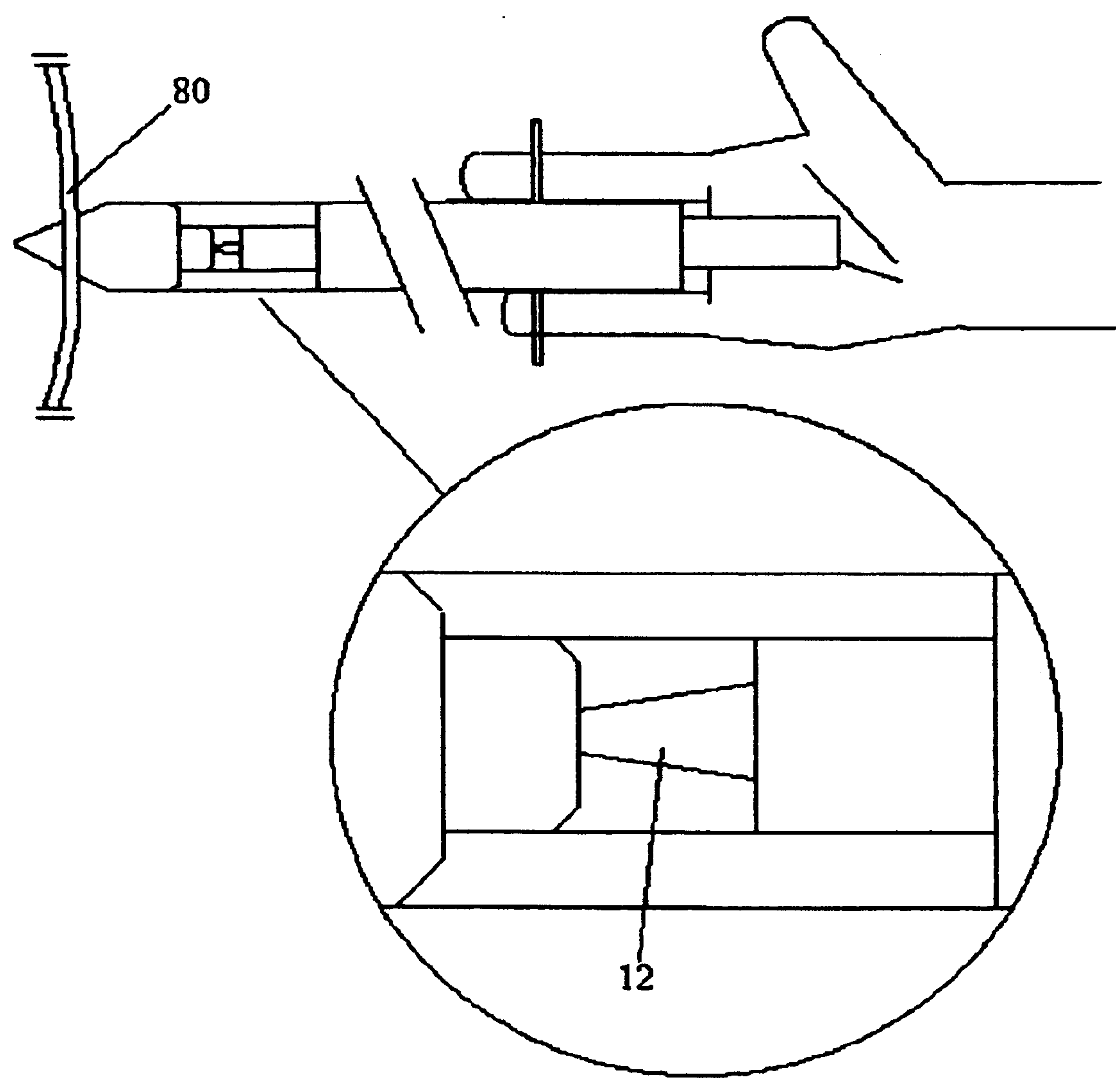

More specifically, and with reference to FIGS. 10 through 18, in FIG. 10, the hand proceeds to the unit. The unit is in a relaxed or closed position urged there by springs. In FIG. 11 the hand is in contact with the unit. The unit is still in a closed position. The test wire 80 approaches. In FIG. 12 the hand is in contact with the unit. The fingers retract the stainless probe. The palm moves distal to the inner sleeve. The wire is approached. In FIG. 13 the fingers fully retract the stainless probe. The palm is holding the inner sleeve in position. The unit is in an open position. The wire is moved into position. In FIG. 14 the unit is in an open position. The test wire is moved into the inner sleeve and ready for insertion of the stainless probe. In FIG. 15 the wire is still in position. The inner sleeve holds the wire in place. The fingers and palm release allowing the stainless probe to pierce the wire insulation. The insulated wire is ready for testing. In FIG. 16 the fingers and palm retract the stainless probe and move the inner sleeve forward and the wire is released. In FIG. 17 the probe is moved away from the test wire. In FIG. 18 the probe is moved to a closed position.

Figure 4:
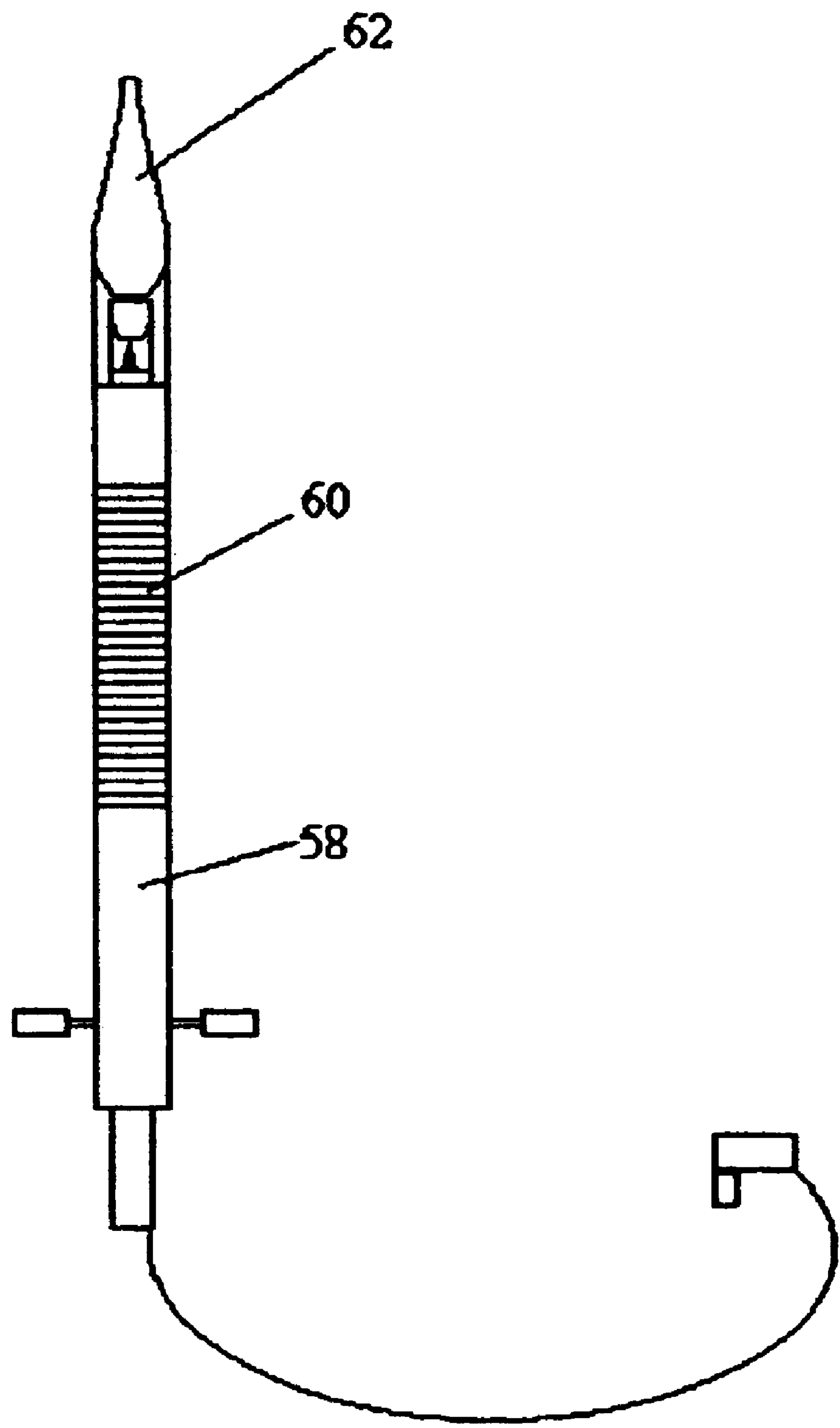
FIG. 4 is a front elevational view of an alternative embodiment of the present invention wherein the outer sleeve and probe are flexible.
Figure 5:
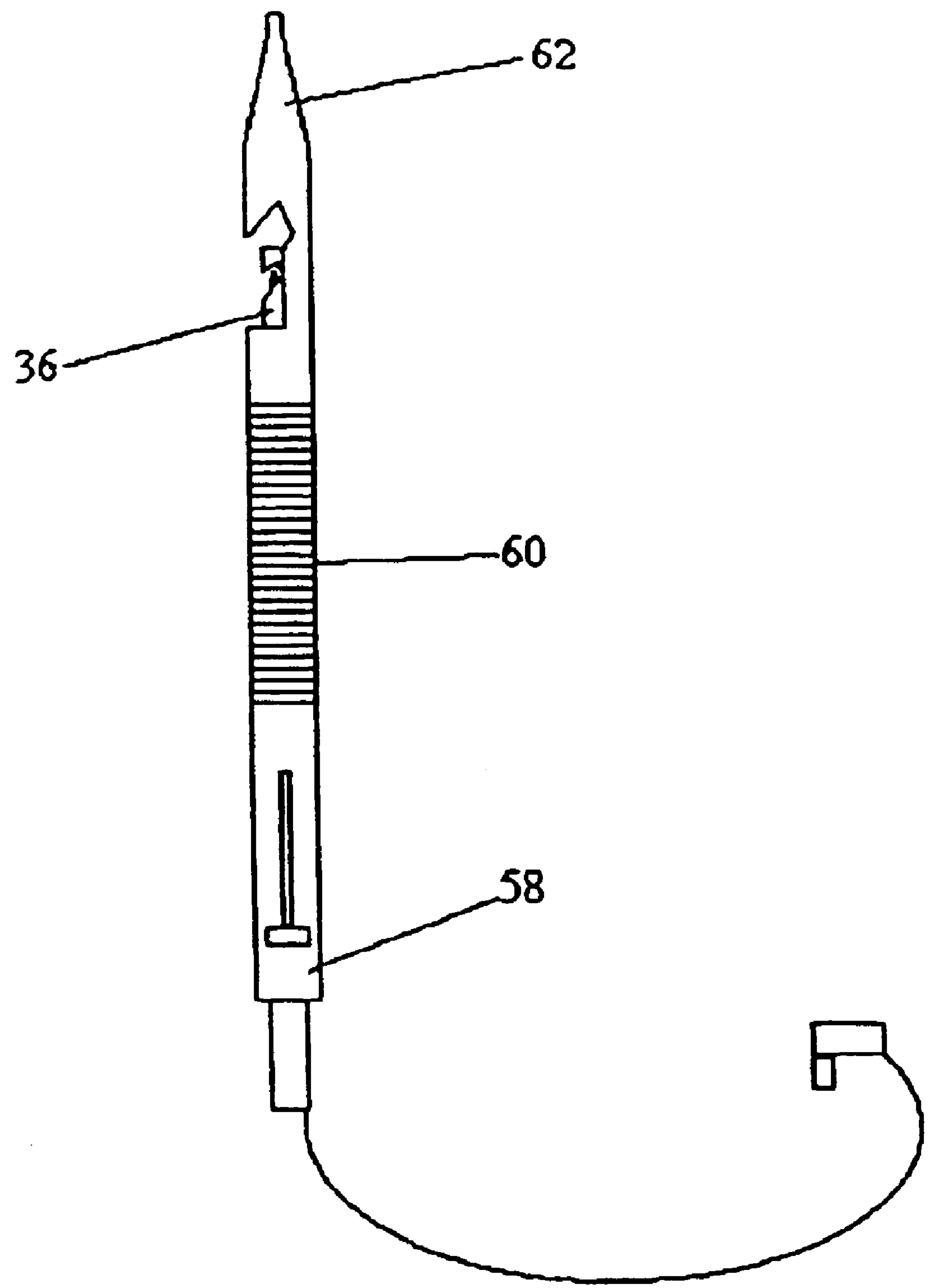
FIG. 5 is a side elevational view of the first alternative embodiment of the present invention wherein the outer sleeve and probe are flexible.
Figure 6:
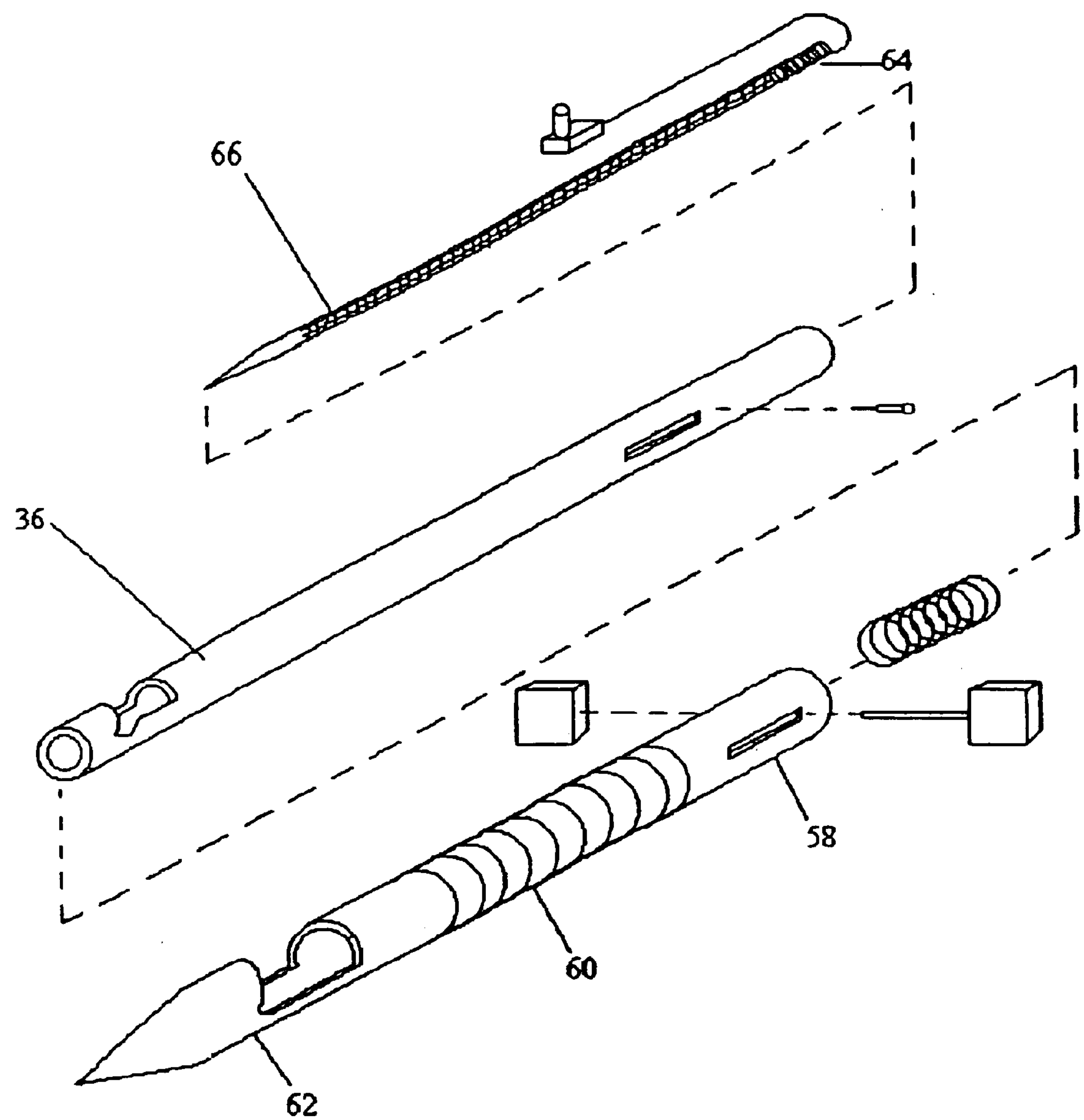
FIG. 6 is an exploded view of the first alternative embodiment of the present invention wherein the outer sleeve and probe are flexible.

A first alternate embodiment of the system, as shown in FIGS. 4, 5 and 6, is flexible. This embodiment allows for using in many hard to reach places. The outer sleeve is formed with a rigid proximal end cap 58, a flexible center 60, and a rigid distal end cap 62. A probe spring 64 is attached to the proximal end of the probe. The inner sleeve is flexible and a flexible steel probe 66 is provided.

Figure 7:
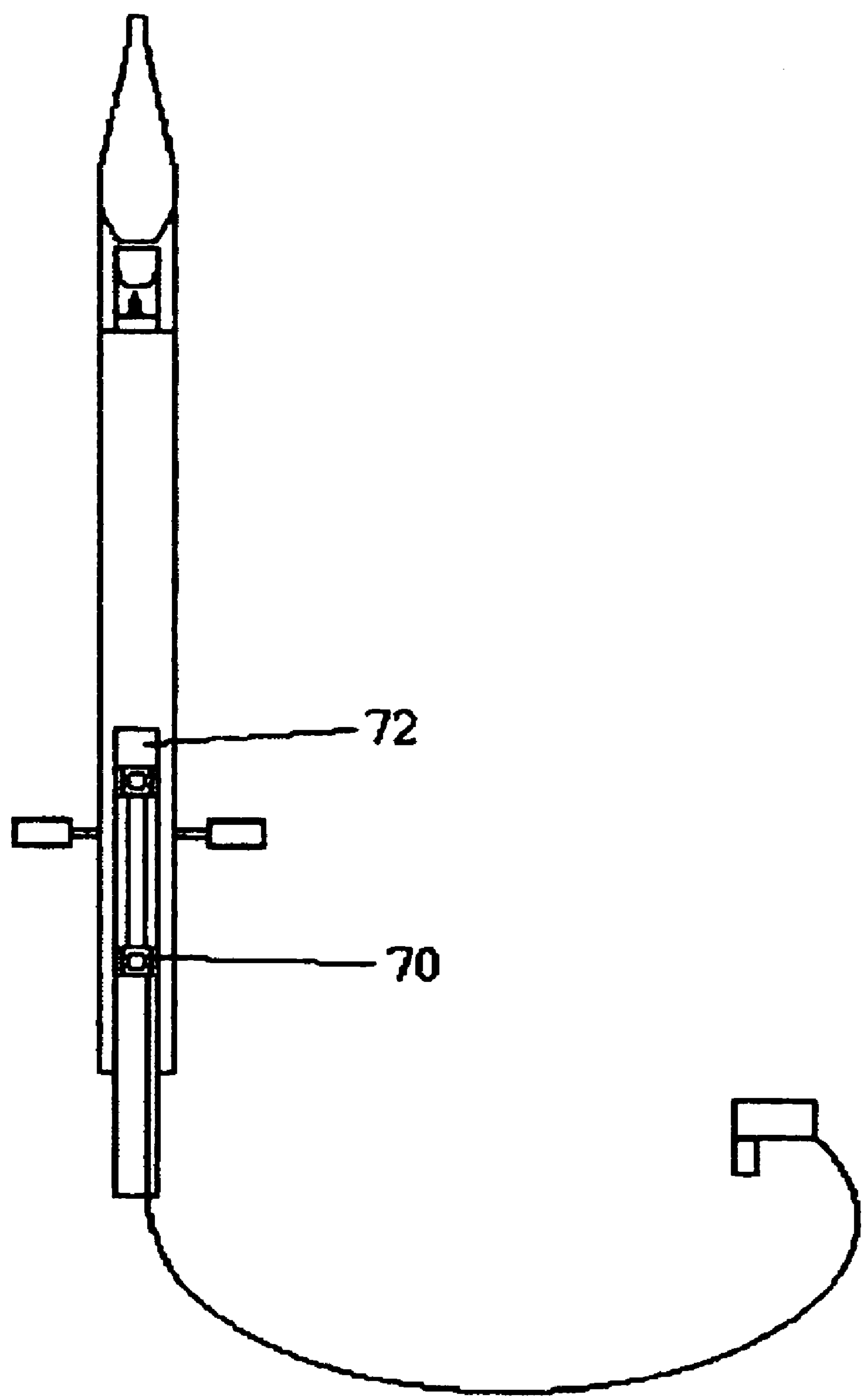
FIG. 7 is a front elevational view of the second alternative embodiment of the present invention wherein the electrical connection comprises a test light circuit.
Figure 8:
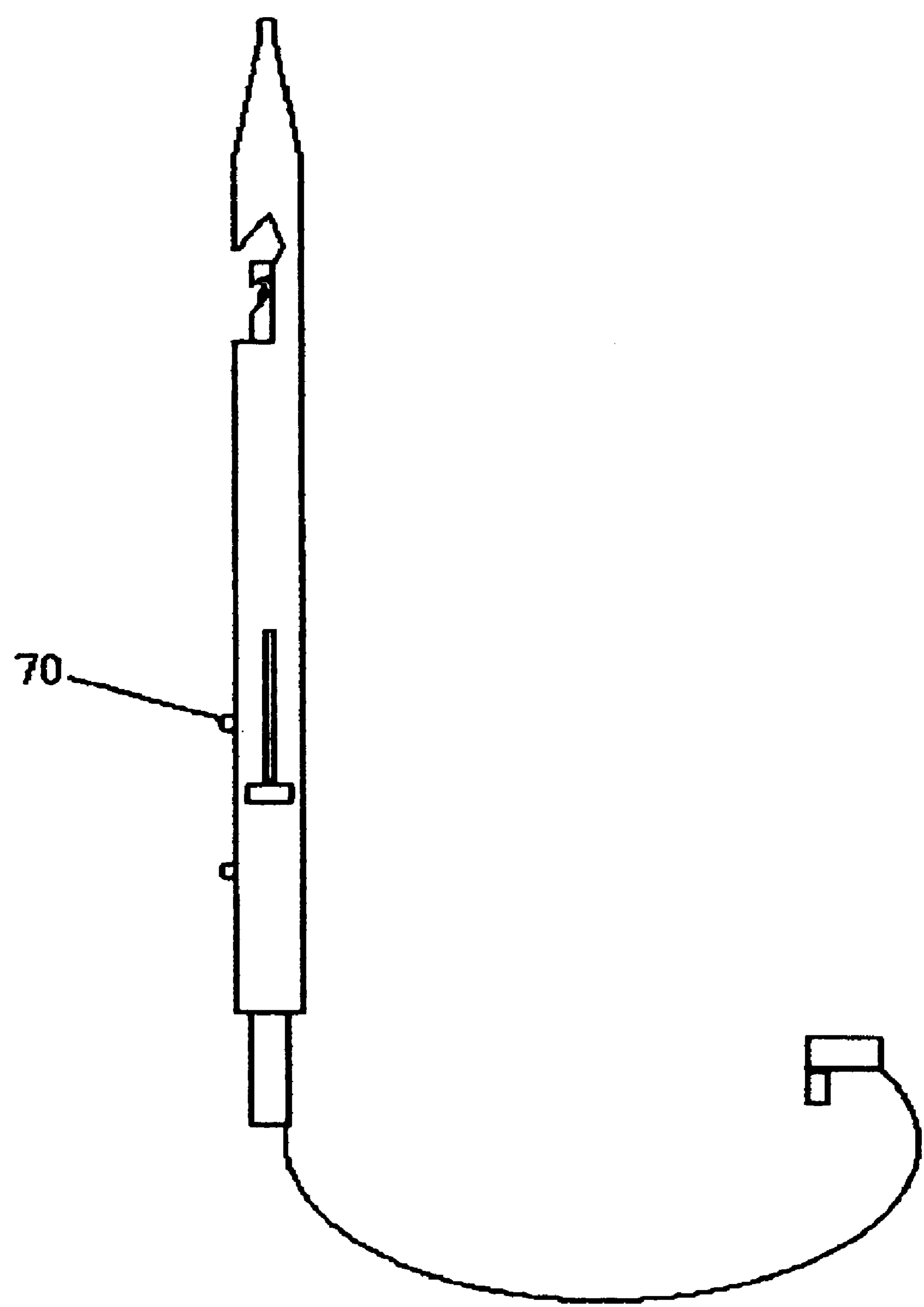
FIG. 8 is a side elevational view of the second alternative embodiment of the present invention wherein the electrical connection comprises a test light circuit.
Figure 9:
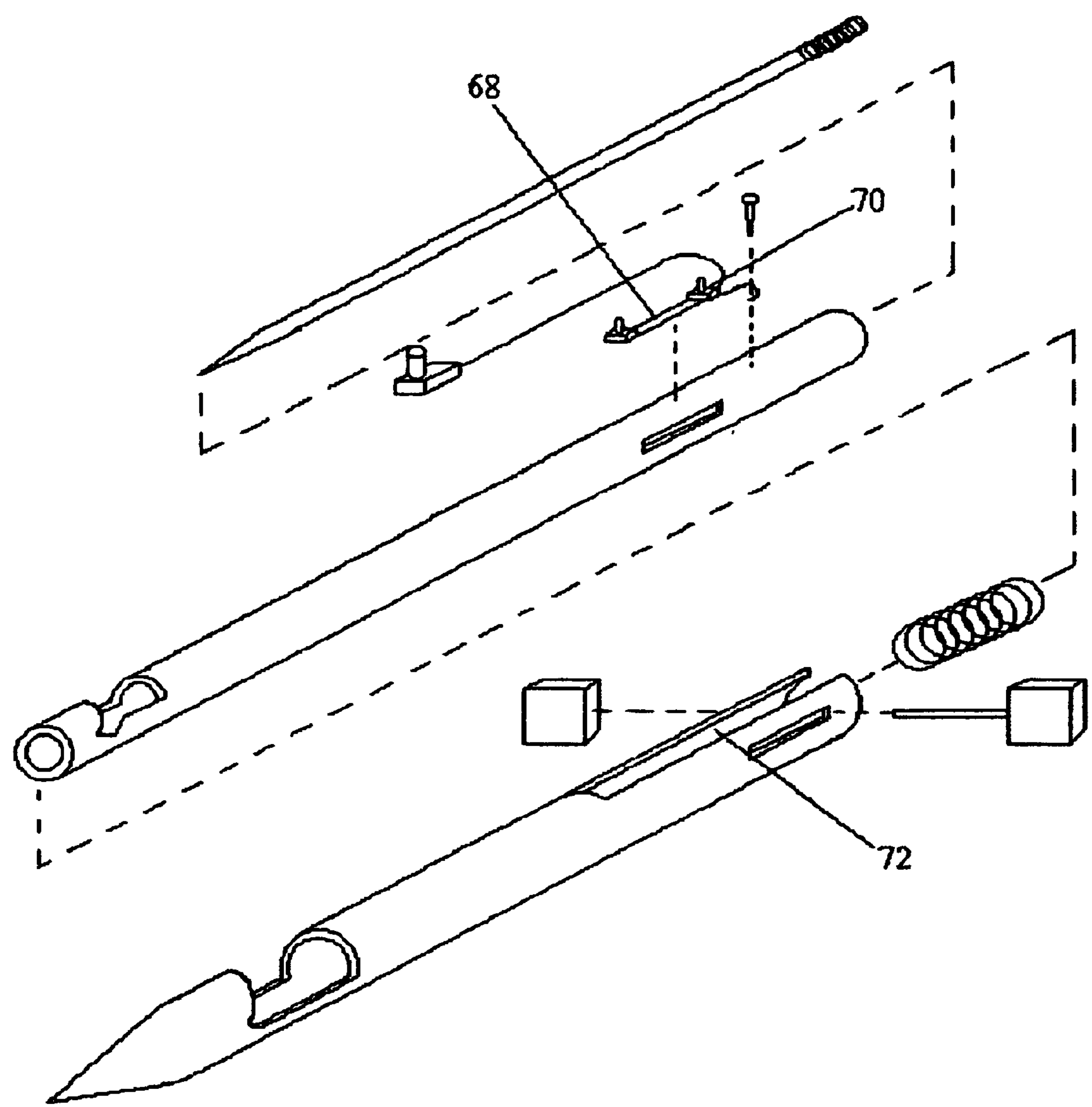
FIG. 9 is an exploded view of the second alternative embodiment of the present invention wherein the electrical connection comprises a test light circuit.

In a second alternate embodiment of the invention, shown in FIGS. 7 and 8 and also in an exploded view in FIG. 9, the electrical connection 68 is composed of a test light circuit 70 coupled to the inner sleeve to maintain an electrical coupling to the probe. This embodiment also provides a lateral slot 72 in the proximal end of the outer sleeve to accommodate the test light circuit during the action of the invention.

The present invention offers several advantages over any existing lead designed for use with a standard multi-meter presently known. The lead tip is controlled by the action of the fingers located at the base of the lead shaft. The design offers manufacturing abilities for lengths of the lead to be as long as necessary for the job market requirement. The design offers one-handed operation allowing the user to stay clear from electrical circuits. The dual action of the lead tip provides the obtainment and centering of the wire desiring to be attached to and then the piercing of the insulation, if any, to make contact. The dual action of the lead tip provides the safe removal of the wire attached by self removing the piercing tip and then pushing the wire out of the centering body. Therefore, the wire is then free to be removed from the lead. The present invention offers one-handed insulated operation allowing the user to insert the lead in restricted areas where contact with other wiring may be critical. The present invention offers one-handed operation allowing the user to insert the lead into restricted areas where contact with casing or areas surrounding the wire being inspected may be critical. The design offers insulated one-hand operation with alternate flexibility in the shaft of the lead allowing further access to wires obstructed by other objects.

The present invention also includes its method of use. More specifically, the method steps include:

a. providing a probe having a distal end formed with a point and a proximal end couplable to supplemental electronic components;

b. providing an outer sleeve having a distal end with a semi-cylindrical opening and a proximal end with a circular opening at the proximal end of the outer sleeve end and slots adjacent to the proximal end of the outer sleeve;

c. providing an inner sleeve having open distal and proximal ends, the inner sleeve being formed with a generally semi-cylindrical opening adjacent to the distal end of the inner sleeve and a pair of diametrically opposed slots adjacent to the proximal end of the inner sleeve, the inner sleeve adapted to slidably receive the probe and with the inner sleeve and the probe adapted to be slidably positioned within the outer sleeve to allow movement of the inner sleeve axially inwardly of the outer sleeve in response to a force by a user;

d. providing a coil spring within the outer sleeve;

e. providing a pair of finger pads with an action pin extending through the outer sleeve and the inner sleeve;

f. pushing the inner sleeve distally and concurrently pulling the finger pads proximally to create a space in the semi-cylindrical openings and positioning a wire to be tested within such space;

g. relieving the force from the inner sleeve and the finger pads to allow the probe to pierce the wire while the inner sleeve applies an opposing force;

h. pushing the inner sleeve distally and concurrently pulling the finger pads proximally to withdraw the probe from the wire while the inner sleeve applies a resistive force; and i. removing the wire from the semi-cylindrical openings and relieving the force from the inner sleeve and the finger pads in anticipation of repeating the method.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A multi-meter test lead system for safe, convenient, and accurate testing of lines with a dual action and insulation piercing capabilities for single handed use comprising, in combination:

a probe fabricated of electrically conductive stainless steel in a generally cylindrical configuration having a distal end formed with a point and having a proximal end, a probe spring coupled with respect to the probe to allow retraction of the probe, the probe being further coupled to supplemental electronic components;

an outer hollow sleeve in a generally cylindrical configuration having a distal end and having a semi-cylindrical opening adjacent to the distal end of the outer hollow sleeve for receiving an insulated test lead to be tested and having a proximal end with a pair of diametrically opposed slots with an opening at the proximal end of the outer hollow sleeve;

an inner cylindrical sleeve fabricated of an electrically insulating material having an open distal end and an open proximal end, the inner sleeve being formed with a generally semi-cylindrical opening adjacent to the distal end of the inner cylindrical sleeve and a pair of diametrically opposed slots adjacent to the proximal end of the inner cylindrical sleeve, the inner sleeve adapted to slidably receive the probe and with the inner sleeve and the probe adapted to be slidably positioned within the outer sleeve, the proximal end of the inner sleeve extending proximally of the proximal end of the outer sleeve to allow movement of the inner sleeve axially inwardly of the outer sleeve in response to a force by a user as created by the user's palm;

a coil spring positioned within the outer sleeve adjacent to the distal end of the outer sleeve in contact with the distal end of the inner sleeve to provide a resilient force against the urging of a force by the user's palm on the inner sleeve;

a retaining screw extending through the inner sleeve proximal the slot in the inner sleeve; and a pair of finger pads with an action pin extending through the slots of the outer sleeve and the inner sleeve and coupled to the probe through the probe spring to allow the user to provide a proximal force to the probe after the user has created a distal force through the inner sleeve whereby the probe will move out of the semi-cylindrical opening of the inner sleeve to allow the placing of the insulated test lead therein and whereby upon relieving of the forces by the finger pads and palm of the user, the probe will pierce the insulated test lead in the semi-cylindrical opening to allow for testing for electricity and continuity and whereupon the re-application of forces by the user's fingers and palm, the probe will be retracted from the insulated test lead while the semi-cylindrical opening provides a counter-acting force pushing the wire away from the point of the probe.

2. A multi-meter test lead system comprising:

a probe having a distal end formed with a point and a proximal end couplable to supplemental electronic components;

an outer sleeve having a distal end with a semi-cylindrical opening and a proximal end with a circular opening at the proximal end of the outer sleeve end and slots adjacent to the proximal end of the outer sleeve;

an inner sleeve having open distal and proximal ends, the inner sleeve being formed with a generally semi-cylindrical opening adjacent to the distal end of the inner sleeve and a pair of diametrically opposed slots adjacent to the proximal end of the inner sleeve, the inner sleeve adapted to slidably receive the probe and with the inner sleeve and the probe adapted to be slidably positioned within the outer sleeve to allow movement of the inner sleeve axially inwardly of the outer sleeve in response to a force by a user;

a coil spring within the outer sleeve; and a pair of finger pads with an action pin extending through the outer sleeve and the inner sleeve.

3. The system as set forth in claim 2 wherein the probe is flexible and the outer sleeve is formed with a rigid proximal end cap, a flexible center, and a rigid distal end cap, and wherein the inner sleeve is flexible and further including a probe spring attached to the proximal end of the probe.

4. The system as provided in claim 2 wherein an electrical connection is composed of a lighted circuit coupled to the inner sleeve to maintain an electrical coupling to the probe and the outer sleeve having a lateral slot in the proximal end.

5. A method of using a multi-meter test lead system comprising the steps of:

providing a probe having a distal end formed with a point and a proximal end couplable to supplemental electronic components;

providing an outer sleeve having a distal end with a semi-cylindrical opening and a proximal end with a circular opening at the proximal end of the outer sleeve end and slots adjacent to the proximal end of the outer sleeve;

providing an inner sleeve having open distal and proximal ends, the inner sleeve being formed with a generally semi-cylindrical opening adjacent to the distal end of the inner sleeve and a pair of diametrically opposed slots adjacent to the proximal end of the inner sleeve, the inner sleeve adapted to slidably receive the probe and with the inner sleeve and the probe adapted to be slidably positioned within the outer sleeve to allow movement of the inner sleeve axially inwardly of the outer sleeve in response to a force by a user;

providing a coil spring within the outer sleeve at the distal end of the outer sleeve;

providing a pair of finger pads with an action pin extending through the outer sleeve and the inner sleeve;

pushing the inner sleeve distally and concurrently pulling the finger pads proximally to create a space in the semi-cylindrical openings and positioning a wire to be tested within such space;

relieving the force from the inner sleeve and the finger pads to allow the probe to pierce the wire while the inner sleeve applies an opposing force;

pushing the inner sleeve distally and concurrently pulling the finger pads proximally to withdraw the probe from the wire while the inner sleeve applies a resistive force; and removing the wire from the semi-cylindrical openings and relieving the force from the inner sleeve and the finger pads in anticipation of repeating the method.

* * * * *